(12) United States Patent
Perrin et al.

(10) Patent No.: US 6,281,469 B1
(45) Date of Patent: Aug. 28, 2001

(54) CAPACITIVELY COUPLED RF-PLASMA REACTOR

(75) Inventors: Jerome Perrin, Paris; Mustapha Elyaakoubi, Massy; Jacques Schmitt, La Ville du Bois, all of (FR)

(73) Assignee: Unaxis Balzers Aktiengesellschaft, Fuerstentum (LT)

( * ) Notice: Subject to any disclaimer, the term of this patent is extended or adjusted under 35 U.S.C. 154(b) by 0 days.

(21) Appl. No.: 09/360,247

(22) Filed: Jul. 23, 1999

Related U.S. Application Data

(63) Continuation-in-part of application No. 08/784,578, filed on Jan. 17, 1997, now Pat. No. 5,981,899.

(51) Int. Cl.[7] .................................................. B23K 10/00
(52) U.S. Cl. ............................... 219/121.43; 219/121.52; 219/121.41; 156/345; 118/723 I
(58) Field of Search ........................... 219/121.52, 121.4, 219/121.41, 121.43, 121.48; 315/111.21, 111.31; 196/345, 646.1; 118/723 R, 723 I

(56) References Cited

U.S. PATENT DOCUMENTS 5,609,690   3/1997   Watanabe et al. .

FOREIGN PATENT DOCUMENTS

| 4404077 | 8/1995 | (DE) . |
|---|---|---|
| 0099174 | 5/1983 | (EP) . |
| 06005522 | 1/1994 | (JP) . |
| 06211649 | 9/1994 | (JP) . |
| 07 226395 | 8/1995 | (JP) . |

*Primary Examiner*—Mark Paschall
(74) *Attorney, Agent, or Firm*—Crowell & Moring, L.L.P.

(57) ABSTRACT

A capacitively coupled RF plasma reactor allows treatment of large workpiece surfaces with an accurate control of ion bombardment onto the respective electrode surfaces and thus an adjacent workpiece, be it to a desired low or to a desired high level. The reactor includes a first and a second electrode arrangement mutually spaced and confining a plasma reaction volume, at lest one of the electrode arrangements comprising electrically mutually isolated sub-electrodes, a first group of the sub-electrodes being commonly connected to a first electric input, and a second group of the sub-electrodes being commonly connected to a second electric input. The reactor thus substitutes at least one of the two customarily used reactor electrodes by an array of sub-electrodes which, by way of their respective first and second electric inputs, may be independently and thus differently electrically operated, usually but not exclusively with RF voltages.

45 Claims, 11 Drawing Sheets

Figure 7:
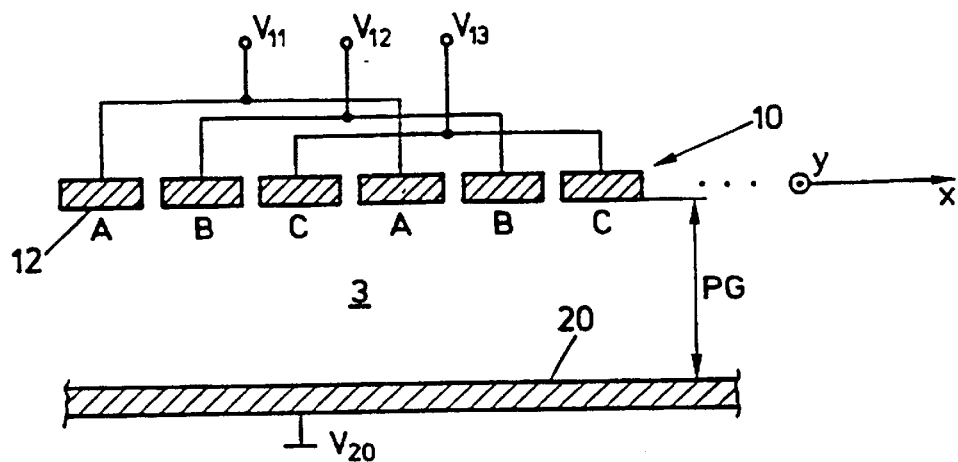

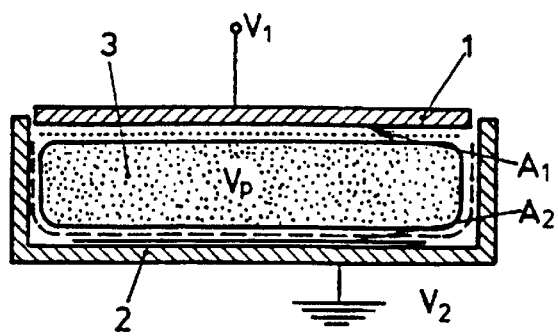
FIG.1
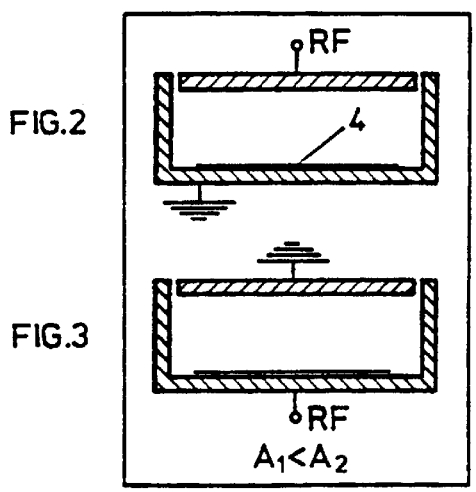
FIG.2
FIG.3
$A_1 < A_2$
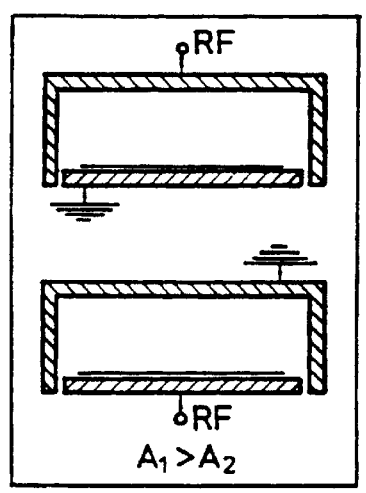
FIG.4
FIG.5
$A_1 > A_2$
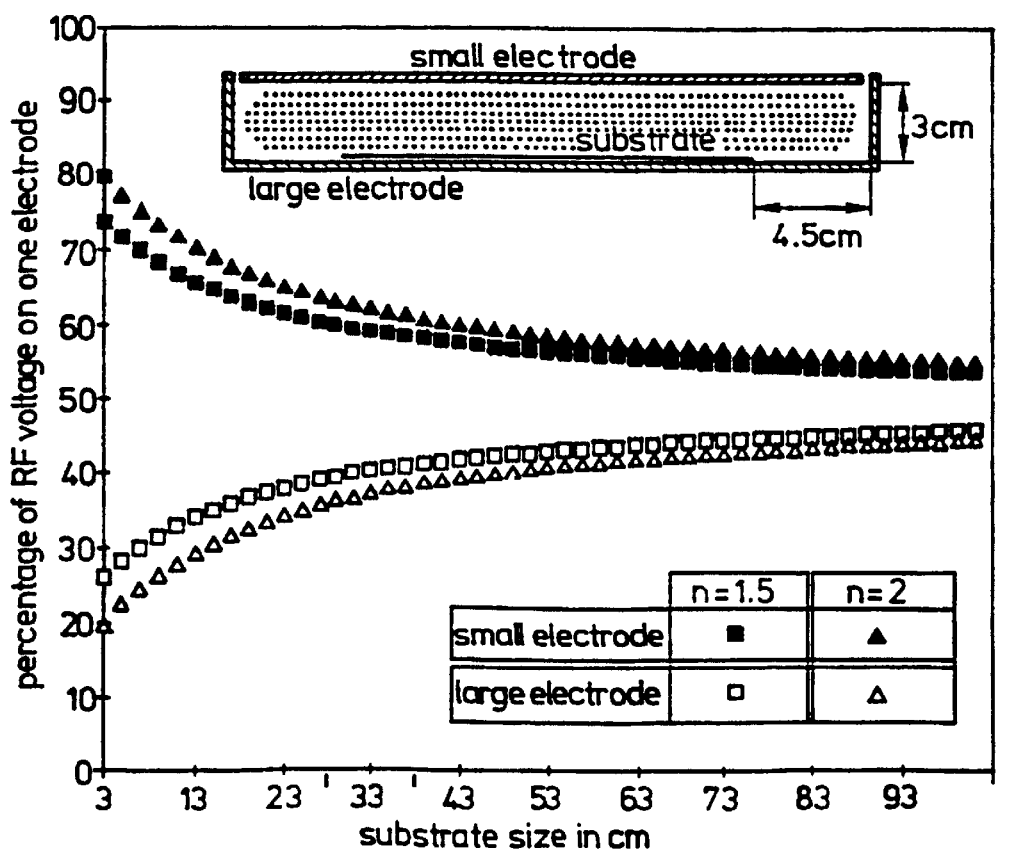
FIG.6

CAPACITIVELY COUPLED RF-PLASMA REACTOR

CROSS-REFERENCE TO RELATED APPLICATIONS

This application is a continuation-in-part of U.S. application Ser. No. 08/784,578 filed on Jan. 17, 1997 now U.S. Pat. No. 5,981,899.

BACKGROUND OF THE INVENTION

Customary, capacitively coupled RF-plasma reactors comprise first and second mutually spaced electrodes which concomitantly confine the plasma reaction volume. Besides of the two electrodes, their electrode conductive surfaces, no further electroconductive parts act as a third electrode with an externally applied electrical potential into the plasma reaction volume. Therefore, typical capacitively coupled RF-plasma reactors are also said "diode type" reactors. Confining the plasma reaction volume between the two electrodes which are mutually driven at electric RF potential is normally achieved in providing a spacing at the border of the two electrodes which suffices for electric isolation in terms of DC, but which prevents spreading of the plasma discharge outside the space confined by the two electrodes. This may be achieved e.g. by spacing the two electrodes at their periphery by a distance smaller than dark space distance at the respective operating conditions.

Such capacitively coupled RF-plasma reactors have been used for many years in the field of plasma processing, especially for treating flat substrates such as silicon wafers.

The most common applications of such reactors are Plasma-Enhanced Chemical Vapour Deposition (PECVD) and Plasma Dry Etching. Plasma Dry Etching can be divided into Reactive Ion Etching (RIE), in which ion bombardment is used to promote an anisotropic etching, or in Plasma Etching (PE), in which ion bombardment is to be avoided.

Plasma cleaning, removal of a polymer resist (Ashing) or plasma induced surface activation of workpieces can also be performed in a capacitively coupled RF plasma reactor. Most such reactors are construed with planar electrodes.

In these applications the plasma is generated by a driving RF voltage, most commonly for industrial applications at a frequency of 13.56 MHz.

An RF-driven plasma develops a large self bias voltage between the plasma and the plasma reaction volume surrounding walls which are, as was stated, the electrode surfaces. This is due to the rectifying effect of the RF voltage across the plasma sheath by the plasma sheath according to the dark space adjacent to each of the electrode surfaces towards the plasma discharge or reaction volume. As a consequence, in a classical capacitively coupled RF reactor the ion bombardment of the workpiece or substrate is governed by the ratio between the two electrode surface areas which are in contact with the plasma discharge. Most plasma self bias, enhancing ion bombardment, arises adjacent to the electrode surface of the smaller electrode area, and the potential difference across the sheath or dark-space adjacent to the larger area electrode is accordingly smaller. This effect is conveniently exploited by plasma process designers to taylor the ion bombardment on the substrate. E.g. for RIE the workpiece or substrate is placed adjacent or on the smaller-area electrode coupled to the plasma which results in larger ion bombardment. Inversively, for PE the workpiece is placed adjacent or on the larger-area electrode where ion bombardment is smaller.

There is today a need for plasma processing of large surface workpieces as e.g. of large surface glass plates. E.g. the flat display industry is today considering manufacturing on such plates of about 1 $m^2$. The type of processes to be performed to produce the pixel related electronic circuits on such glass plates are of the same nature as the processes used in micro-electronics, but have to be performed on significantly larger surface workpieces.

If a large surface substrate is to be processed by a capacitively coupled RF plasma reactor and at process conditions similar to those as used when treating silicon wafers, the plasma gap (the distance between the two electrodes, e.g. of a planar capacitive reactor) must be kept at the predetermined value in order to achieve the number of collisions for exited species as desired. Thus, a typical value for plasma gap is between 1 and 10 cm (both limits included).

With the large surface workpieces and such plasma gaps the electrodes of the reactor take a very extended aspect ratio and the electrode surface area ratio becomes close to 1. This implies that in a capacitively coupled RF plasma reactor for large surface workpieces there is almost no control of ion bombardment. The ion bombardment occurs substantially equally at both electrode surfaces. Such a situation is strongly limiting processing large-size workpieces and especially large-size substrates by known capacitively coupled RF plasma processes as they were developed for the micro-electronic industry.

SUMMARY OF THE INVENTION

It is an object of the present invention to provide a capacitively coupled RF plasma reactor which allows treatment of large workpiece surfaces with an accurate control of ion bombardment onto the respective electrode surfaces and thus an adjacent workpiece, be it to a desired low or to a desired high level.

This is inventively achieved by the capacitively coupled RF-plasma reactor, comprising
- a first and a second electrode arrangement mutually spaced and confining a plasma reaction volume,
- at least one of the electrode arrangements comprising electrically mutually isolated sub-electrodes,
- a first group of the sub-electrodes being commonly connected to a first electric input,
- a second group of the sub-electrodes being commonly connected to a second electric input.

This concept of the novel capacitively coupled RF-plasma reactor thus substitutes at least one of the two customary used reactor electrodes by an array of sub-electrodes which by means of their respective first and second electric inputs may be independently and thus differently electrically operated, usually but not exclusively with RF voltages.

In a most preferred embodiment the sub-electrodes of one group and the sub-electrodes of the second group alternate periodically, thus e.g. one after the other as considered at least along one direction along the subdivided electrode arrangement. In the preferred mode of realisation where sub-electrodes of the at least two sub-electrode groups respectively connected to different electric inputs, especially RF inputs, are periodically alternating, the distance from one sub-electrode connected to one RF input to the next such sub-electrode connected to the same RF input and thus local periodicity of the sub-electrode pattern with respect to their electric feed should be of the order or less than the extent of the plasma gap between the two mutually facing electrode arrangements. This makes sure that the workpiece surface to be treated is subjected to an "averaged" effect of plasma discharge.

In a simplified consideration it may be said that with the inventive reactor the workpiece surface to be treated is exposed to a multitude of different sub-RF plasma discharges generated in local parallelism and operated at selectable and thus mutually different RF signal amplitudes and/or phasing and/or frequencies and/or voltage-shapes and which nevertheless interact in the plasma reaction volume to result in the said "averaged" effect.

SHORT DESCRIPTION OF THE FIGURES

Figure 8:
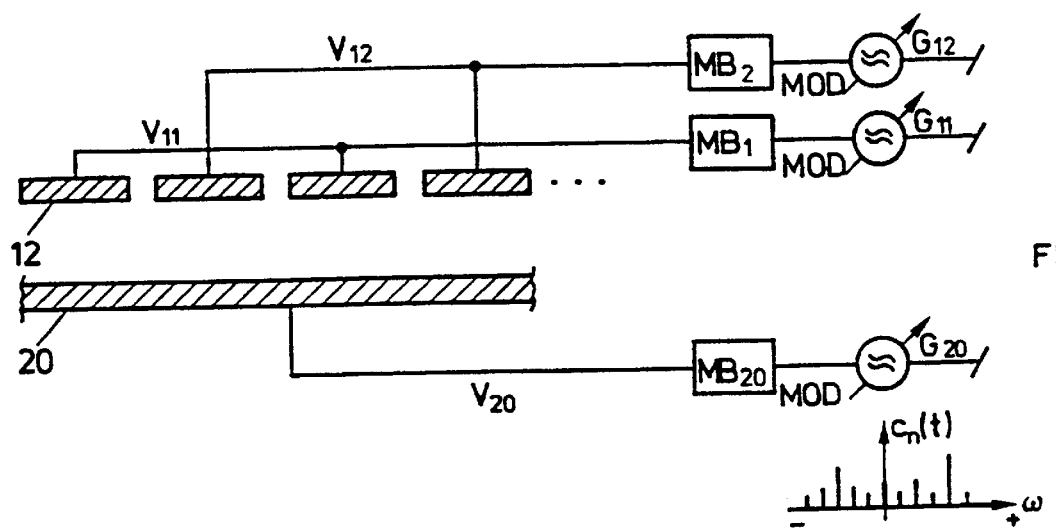
Figure 9:
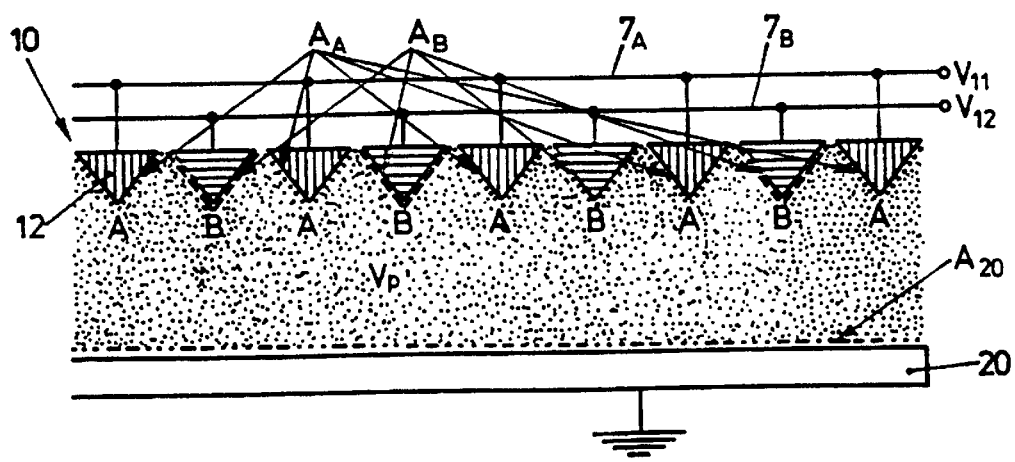
Figure 10:
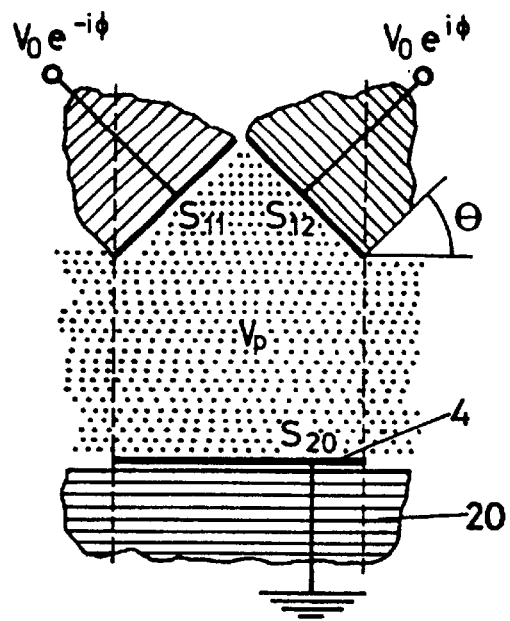
Figure 11:
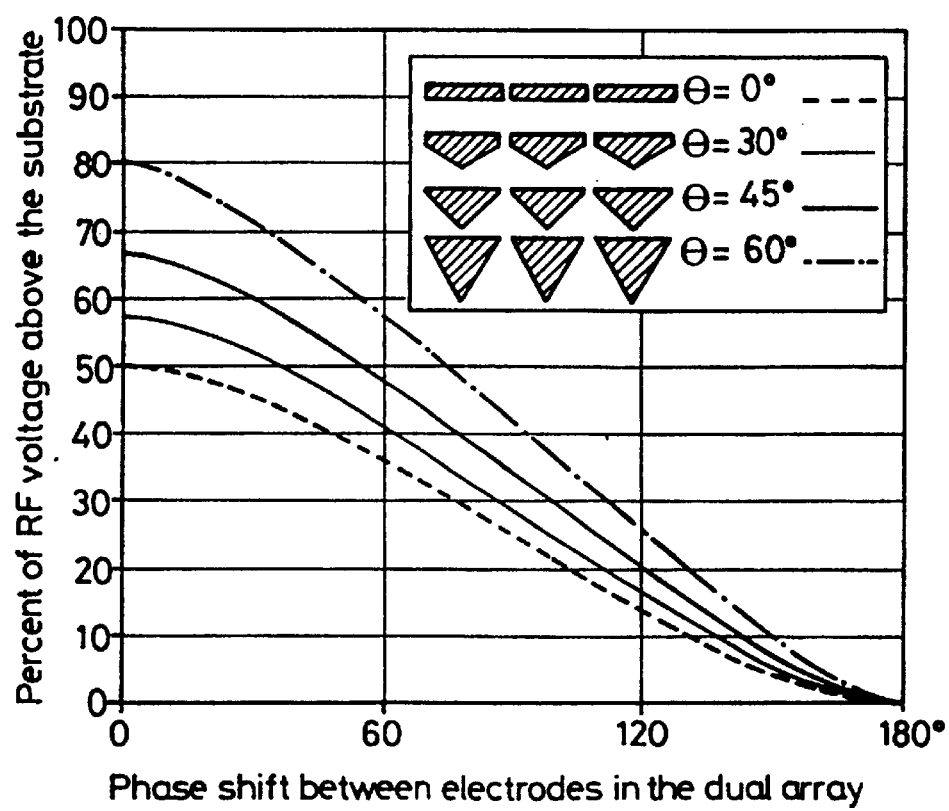
Figure 12:
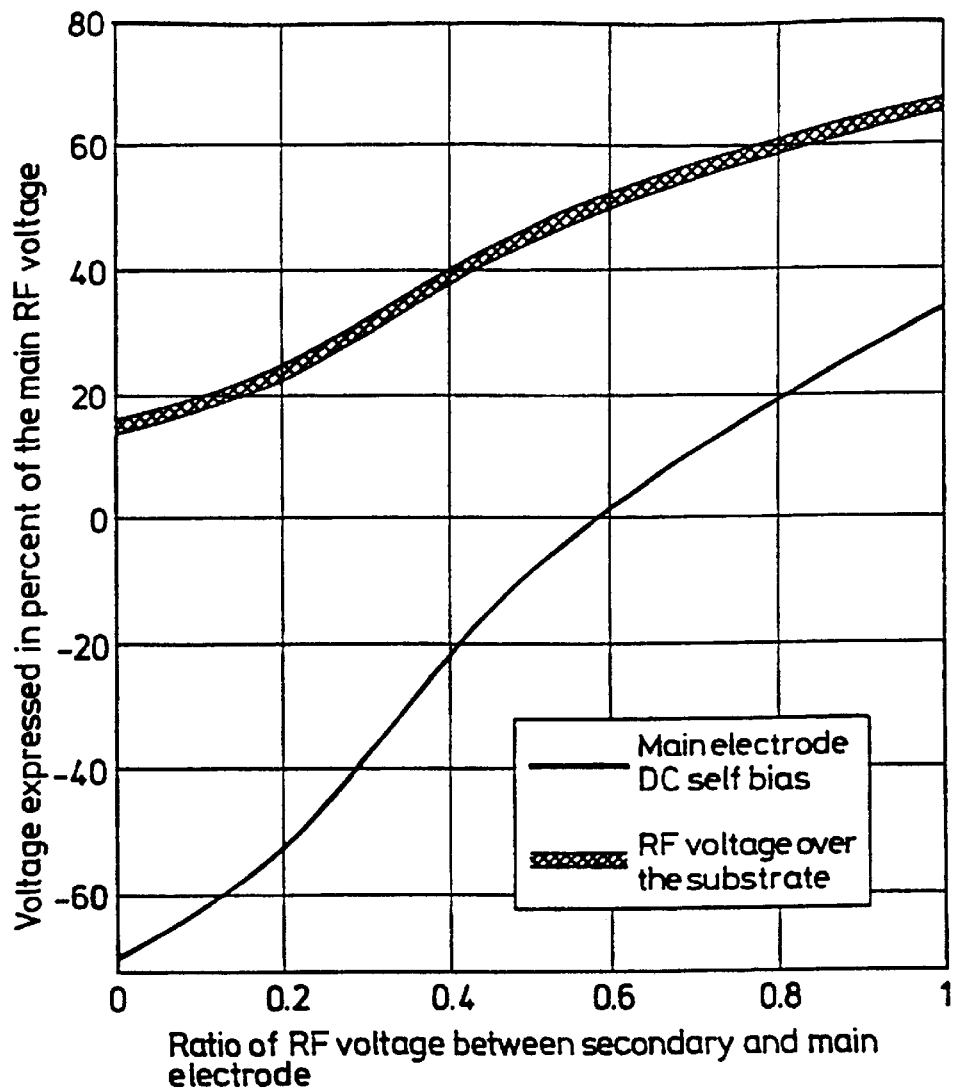
Figure 13:
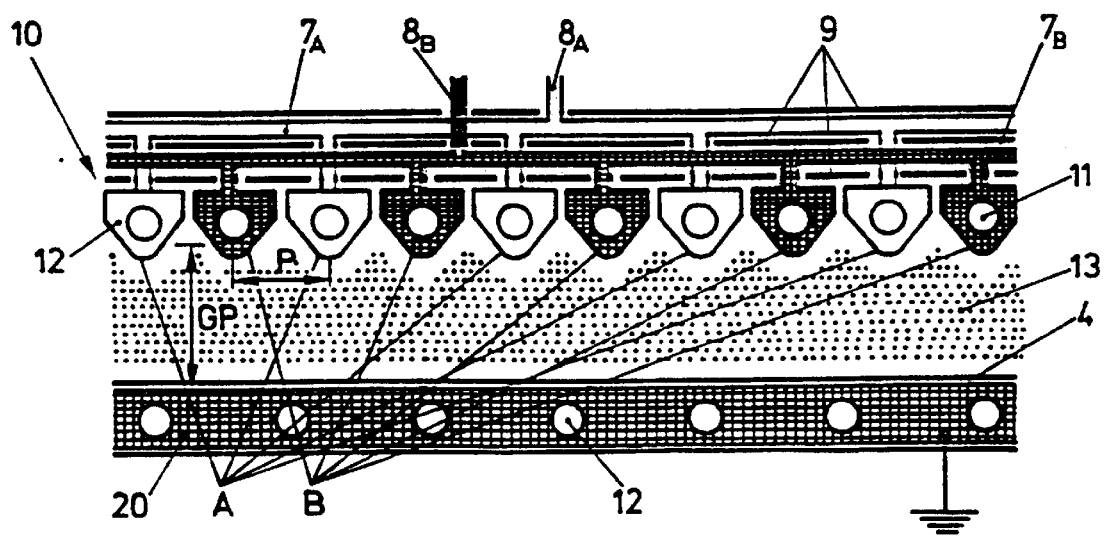
Figure 14:
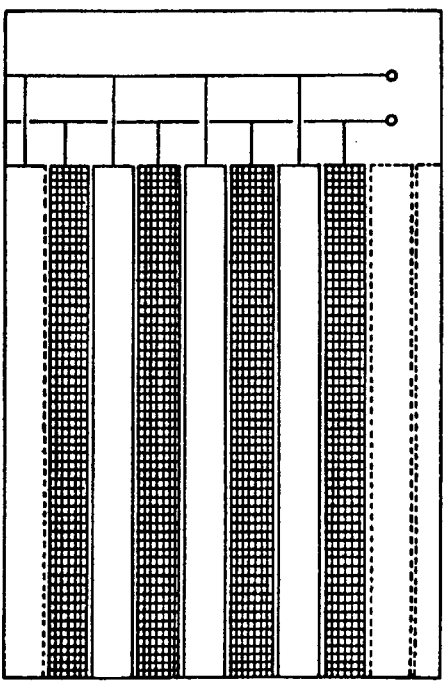
Figure 15:
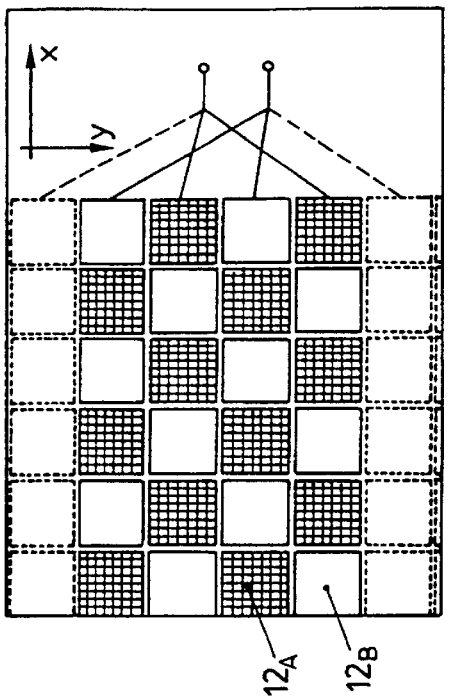
Figure 16:
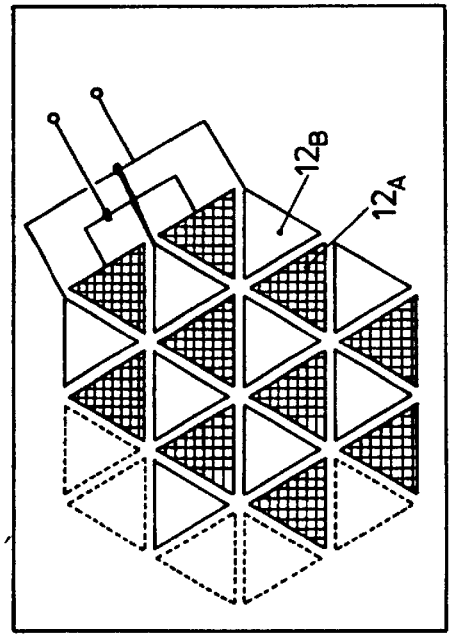
Figure 17:
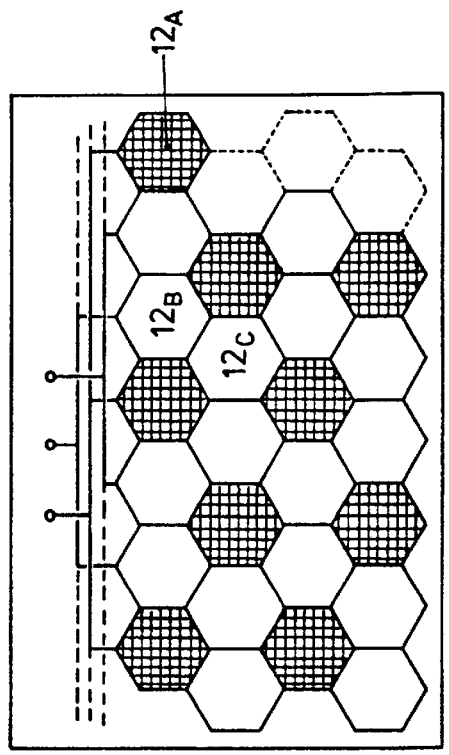
Figure 18:
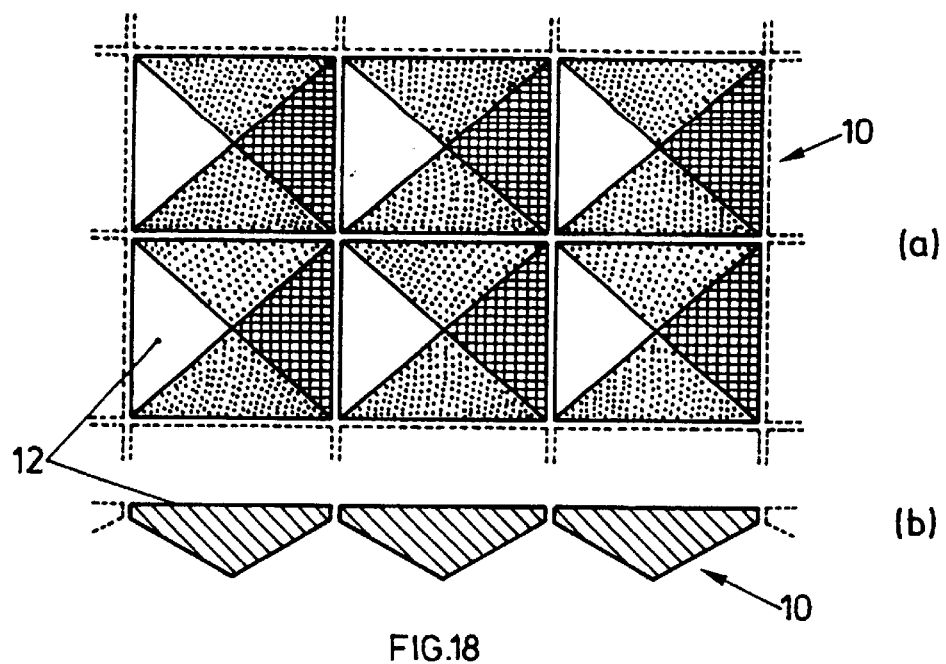
Figure 19:
Figure 20:
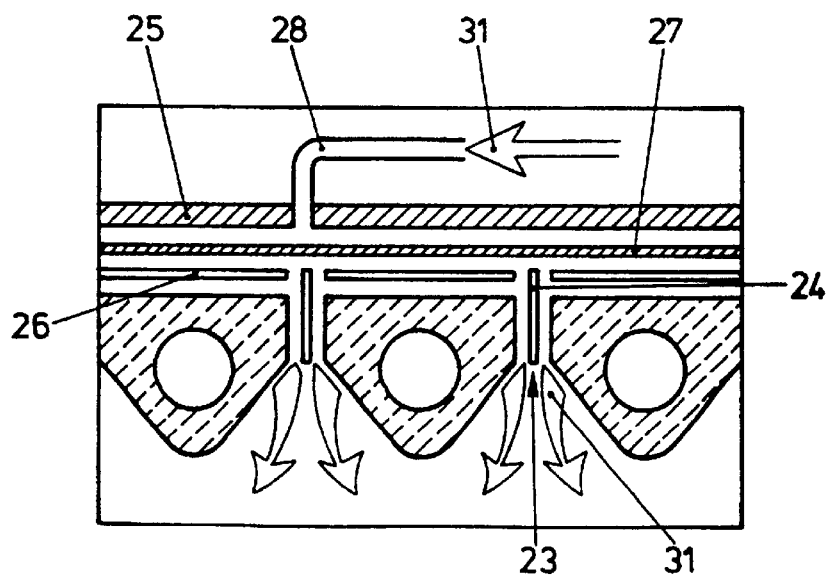
Figure 21:
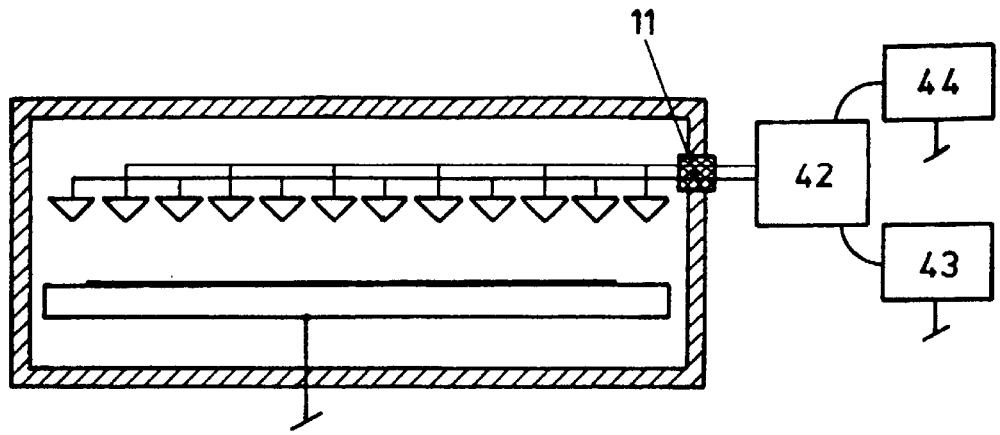
Figure 22:
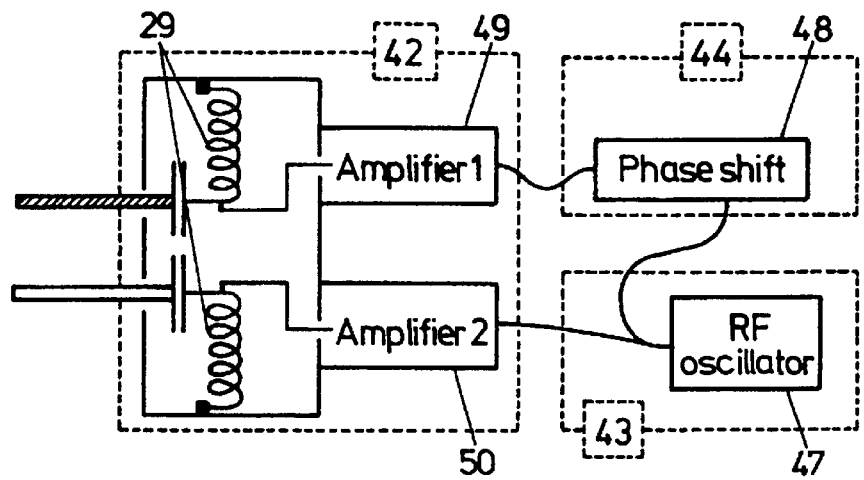
Figure 23:
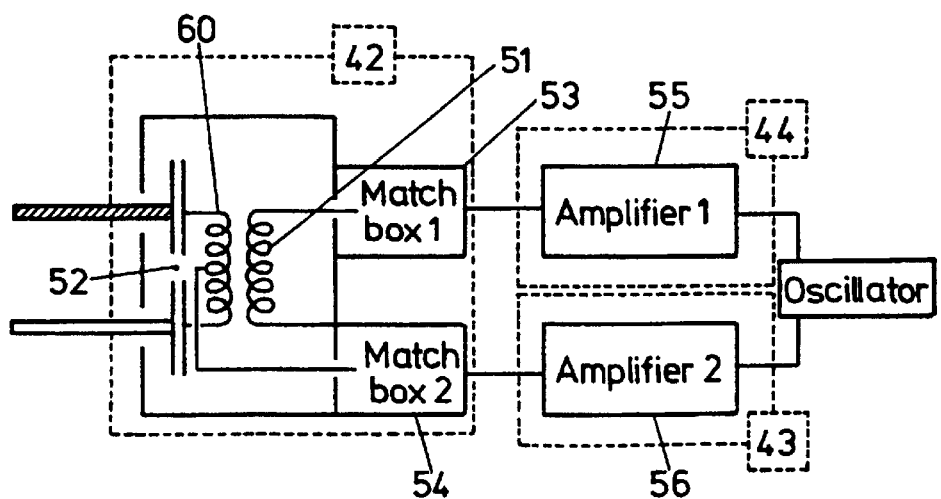
Figure 24:
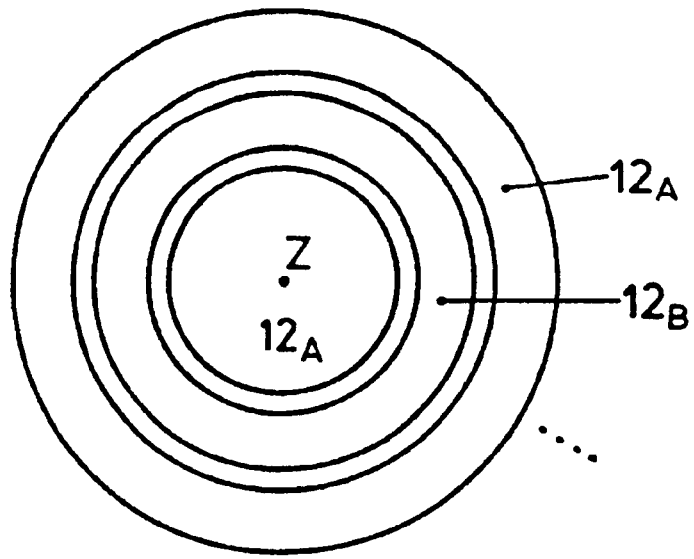
Figure 25:
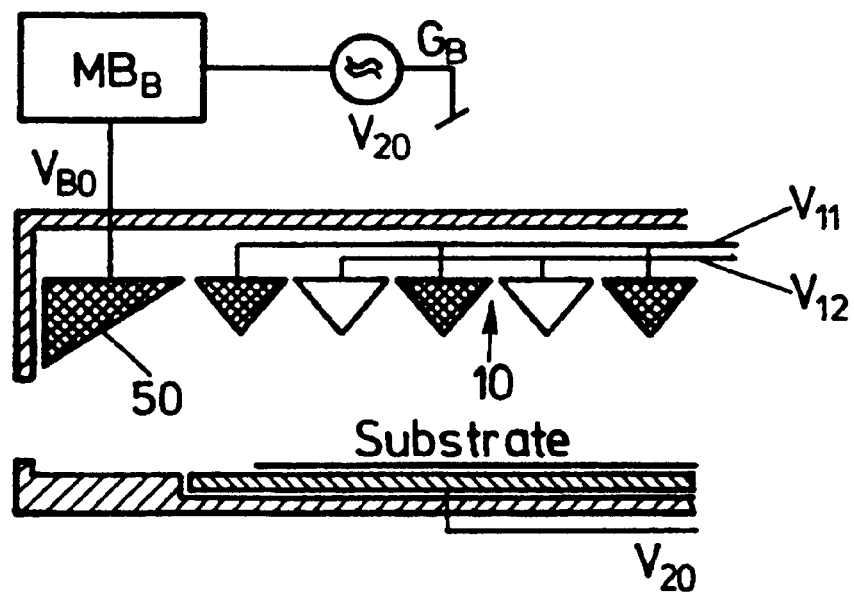
Figure 26:
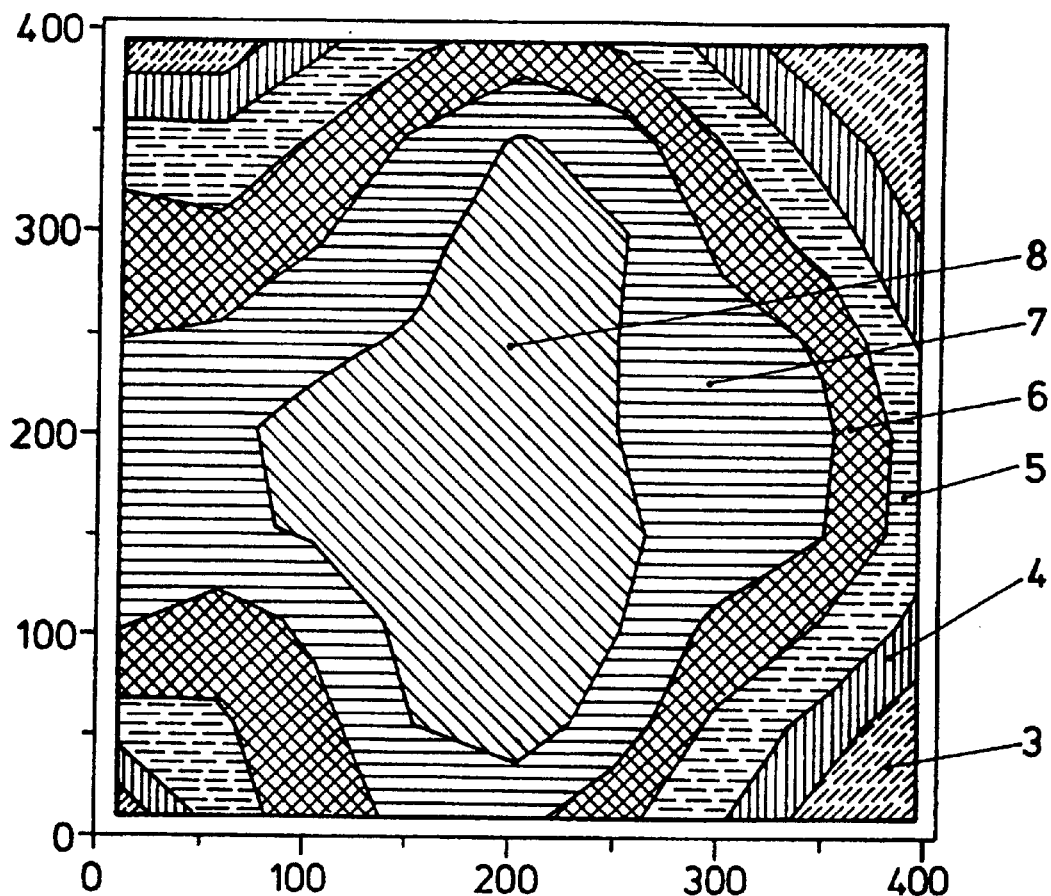
Figure 27:
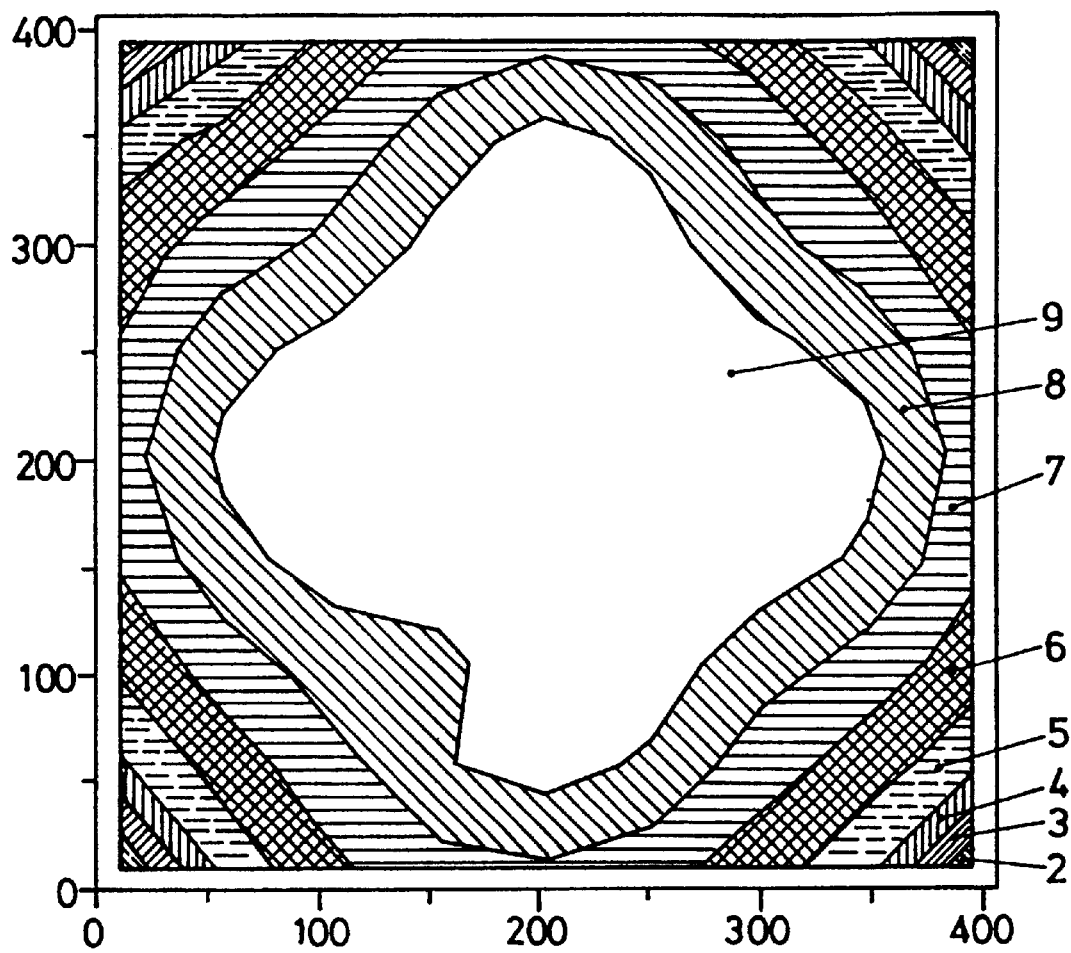
Figure 28:
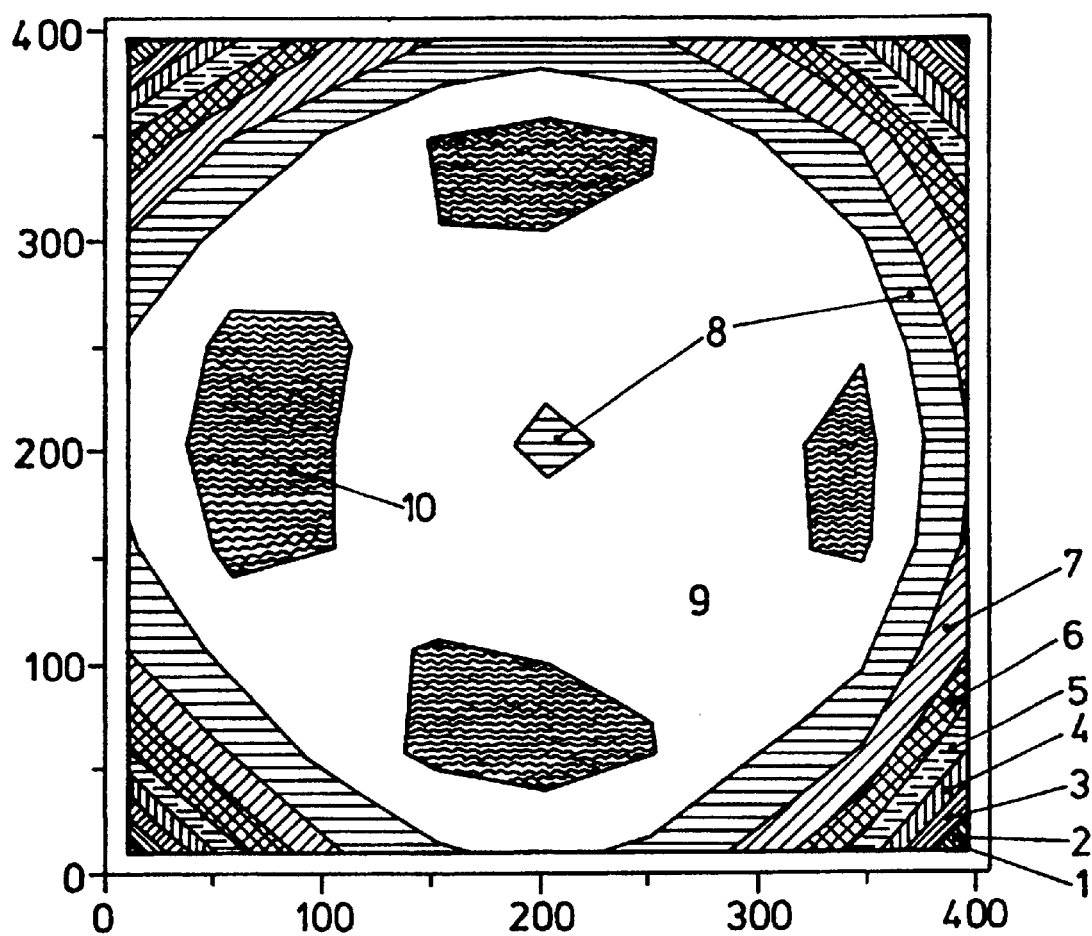

The present invention shall now be described by way of examples and with reference to the accompanying drawings. They show:

FIG. 1: Schematically a prior art capacitively coupled RF-plasma reactor,

FIG. 2 to FIG. 5: four different possibilities of RF-feed to a reactor according to FIG. 1 and of arranging a workpiece with respect to larger or smaller electrode, depending on the desired ion bombardment on the surface of the workpiece to be treated, FIG. 6: the dependency of percentage of RF voltage across the plasma sheath at one electrode from substrate size and depending of whether the substrate or workpiece is deposited on the smaller or on the larger area of the plasma reaction volume confining electrodes at a prior art reactor as shown in FIGS. 1 to 5, FIG. 7: in a schematic representation the generic electrode arrangement of a reactor according to the present invention, FIG. 8: the schematic representation of the generic electrode arrangement of a reactor according to the present invention for explaining the various possibilities of electrical feed to the different electrode arrangements, FIG. 9: departing from the approach as shown in FIG. 7 or 8, schematically the electrode arrangement of the reactor according to the present invention with a preferred shape of sub-electrodes, FIG. 10: an enlarged view of the reactor according to FIG. 9, FIG. 11: as a function of phase-shift between RF voltages applied to sub-electrode groups at the inventive reactor and as a function of sub-electrode shape the resulting calculated percentage of RF voltage at the plasma sheath of the substrate carrying electrode arrangement, FIG. 12: the percentage of RP voltage across the plasma sheath at the substrate carrying electrode and as a function of amplitude ratio of RF voltages applied to two groups of inventively provided sub-electrodes, FIG. 13: in a schematic representation, a preferred construction of the reactor according to the present invention, FIG. 14: schematically the bottom view on the electrode arrangement subdivided in bar-shaped sub-electrodes at a reactor according to the present invention, FIG. 15: in a representation according to FIG. 13 the sub-electrode pattern with two-dimensionally arrayed sub-electrode squares, FIG. 16: in a representation according to FIG. 14 or FIG. 15 provision of triangular sub-electrodes, FIG. 17: in a representation according to one of FIGS. 14 to 16 the provision of groups of honeycomb patterned sub-electrodes, FIG. 18: departing from a sub-electrode pattern according to FIG. 15 the bottom view (a) and cross-sectional view (b) of the sub-electrodes with surface enlarging convex roof shapes, FIG. 19: in a cross-sectional representation the shapes of a further sub-electrode embodiment with curved surface, FIG. 20: an enlarged view of a part of the reactor according to the present invention and to FIG. 13 with additional preferred features, FIG. 21: schematically the RF feed of a reactor according to the present invention, FIG. 22: schematically a first preferred realisation mode of RF feed according to FIG. 21, FIG. 23: schematically a second preferred mode of RF feed according to FIG. 21, FIG. 24: in a schematic bottom view a further structure of sub-electrodes in a centric circular pattern, FIG. 25: in a schematic representation according to FIG. 9 a further preferred embodiment of the inventive plasma reactor with border electrode arrangement, FIGS. 26 to 28: three different distributions of treatment effect on a 400 mm×400 mm substrate and in dependency of DC bias applied.

DETAILED DESCRIPTION OF THE INVENTION WITH REFERENCE TO THE FIGURES

Before explaining the behaviour of the reactor according to the present invention, let us introduce the notations and the method by recalculating the electrical equilibrium of a classical capacitively coupled RF reactor as shown schematically in FIG. 1. Such reactor comprises as was said two electrode arrangements, 1, 2 with respective electrode surfaces $A_1$, $A_2$ which are both capacitively coupled to the plasma 3 within the plasma reaction volume via the respective sheath. The driving RF voltage is generated between the respective electric potentials $V_1$ and $V_2$ whereby usually one of these potentials, say $V_2$, is reference potential, normally ground potential. The plasma potential $V_p$ is unique because a plasma is a conductor and can be considered conductive as a metal for the driving frequencies considered which are well below the plasma frequency. Capacitive RF coupling between one electrode and the plasma depends on the sheath thickness. The sheath can thereby be considered as a vacuum capacitor, the thickness thereof varying with RF voltage or potential-drop across the sheath. The most commonly adopted approach consists in describing the sheath thickness as a power law of the local voltage, i.e. potential difference:

$$e_1 = e_2 |V_1 - V_p|^\alpha, \; e_2 = e_o |V_2 - V_p|^\alpha, \tag{1}$$

where $e_1$ and $e_2$ are the respective sheath equivalent thicknesses and $\alpha$ is a coefficient depending on the range of plasma condition and on the type of plasma chemistry being used.

The relation between $V_1$, $V_2$ and $V_p$ is easily derived considering that the two sheaths act as a capacitive divider:

$$(V_1 - V_p)/(V_p - V_2) = (A_2/e_2) = (A_2/e_1) \tag{2}$$

hence $$|V_1 - V_p|/|V_p - V_2| = (A_2/A_1)^n \text{ with } n = 1/(1-\alpha). \tag{3}$$

We recover here the well known power law as first derived by Koenig et al. (H. H. Koenig and L. I. Maissel, IBM J. Res. Dev. 14, 168 (1970)). In this first derivation n was estimated to be around 4 (hence $\alpha = 0.75$). In fact most electronic process conditions correspond more to n=1.5 to 2, ($\alpha = 0.3$ to 0.5). In any case the net result is that most of the RF voltage is found in front of the smaller electrode surface.

The result of this calculation is displayed in FIG. 6 where the sheath RF voltage is expressed in percentage of the total RF voltage across the plasma. The calculation is for a square substrate with some reasonable assumptions for the plasma gap (3 cm) and the edge distance (4.5 cm). It appears that when the substrate size exceeds 40 cm, it is impossible with a classical reactor to develop on one electrode more than 60% of the RF voltage. It is also impossible to avoid the RF voltage on the larger electrode to be less than 40% of the total voltage.

As the DC voltage developed across an RF sheath is nearly equal to the local RF voltage amplitude, it is difficult for larger substrates to impose voluntarily a large energy ion bombardment when desired, and it is also difficult to avoid some ion bombardment where such bombardment is not desired. Hence RIE is difficult to implement in large substrate capacitive coupling RF-reactors because only half of the potential self bias will be present in front of the substrate. Recovering this factor implies increasing the RF voltage nearly by 2, hence increasing the RF power by a factor of the order of 3 to 4. On the other hand, avoiding ion bombardment is necessary for processes which are likely to cause plasma induced damages. Since this cannot be reduced by the electrode surface ratio it has to be reduced by reducing the RF amplitude at the expense of a longer process time.

In the FIGS. 2 to 5 the different applications of driving RF voltage to the two electrodes of a capacitively coupled RF reactor are shown, thereby with disposal of the workpiece either on the larger electrode for reduced ion bombardment (FIG. 2 and 3) or on the smaller electrode (FIG. 4 and 5) for exploiting ion bombardment.

With the help of FIG. 7 the principal according to the present invention shall now be explained. Again, the plasma reaction volume 3 of the reactor is confined by two electrode arrangements 10 and 20, principally according to the reactor as shown in FIG. 1. In opposition thereto, at least one of the two electrode arrangements, according to FIG. 7 one of them, is subdivided into sub-electrodes 12. Subdivision of the electrode arrangement 10 into electrically and mutually isolated sub-electrodes 12 may be realised just in one direction x along the electrode arrangement 10 so that the sub-electrodes 12 are of a bar-like shape or may be realised in two directions x and y, so that the sub-electrodes 12 form a two-dimensional pattern.

By this it becomes possible to group the sub-electrodes 12 as shown by the groups A, B, C in FIG. 7 and to apply to each of these groups different electric potentials, especially potentials differing generically in amplitude and/or phasing and/or frequency and/or shape, thereby especially such RF potentials. Such different and preferably mutually adjustable driving signals are shown in FIG. 7 by $V_{11}$ to $V_{13}$.

Some general consideration to this inventive concept:

If both electrode arrangements 10 and 20 are e.g. driven on RF potentials and none is linked to a reference potential as e.g. to ground potential, it is absolutely possible to subdivide both electrode arrangements 10 and 20 into sub-electrodes and to also drive the sub-electrodes of the second electrode arrangement at respectively different potentials (not shown).

In a most preferred embodiment of one of the electrode arrangements as arrangement 20 being driven on a reference potential the workpiece is deposited adjacent to the unstructured and reference potential driven electrode arrangement, i.e. adjacent to or on electrode arrangement 20 of FIG. 7.

Although it is absolutely possible so as to exploit all possible desired effects of the novel reactor structure to select the different driving voltages at different frequencies in a most preferred embodiment as proposed presently, the voltages applied differ in amplitude and/or mutual phasing.

As shown in FIG. 7 grouping of the sub-electrodes 12 is preferably realized periodically in that, considered in the direction x, sub-electrodes belonging to the groups A, B, C are arranged periodically alternating. Although this is a most preferred embodiment, it is clear that this periodicity can be omitted or locally interrupted if desired.

In FIG. 7 grouping the sub-electrodes in three respectively RF-driven groups is shown. If desired, more such groups may be realised, but in the today's preferred mode the sub-electrodes are grouped in two differently and further preferably adjustably RF-driven groups.

For the following description we refer to the case according to FIG. 7, where the sub-electrodes 12 are grouped periodically in two groups, let us say A and B.

Thereby, the periodicity, i.e. the distance between two sub-sequent sub-electrodes belonging to the same group should be of the order or less than the extent of the plasma gap according to the distance PG of FIG. 7. This will result in the fact that the workpiece is subjected to an "averaged" effect of the several "plasma columns" operated between respective sub-electrodes and the electrode arrangement 20 of FIG. 7.

The most general formulation for the electrical signal $V_{11}$, $V_{12}$ etc. and $V_{20}$ prevailing at the respective sub-electrode groups and, in case of an undivided single counter-electrode, to that counter-electrode 20 according to FIG. 7 may be written as follows:

$$V_{11}=S_{1(t)}$$

$$V_{12}=S_{2(t)}$$

$$V_{20}=S_{20(t)}$$

Thereby, $S_1$, $S_2$ and $S_{20}$ denote spectral representations of signals, which spectra may vary in time. It must be pointed out that one of the most important spectral amplitudes is that prevailing for zero frequency, thus representing the DC bias-potential at the respective electrode arrangements. As schematically shown in FIG. 8 by respective matching boxes $MB_1$, $MB_2$ and $MB_{20}$ and possibly modulated signal generators $G_{11}$, $G_{12}$ and $G_{20}$ generating an output signal with a desired spectrum and varying in time as desired, the inventive electrode arrangement may be operated to achieve a large scale of different effects with respect to plasma generation. Thereby, additionally either of the three generators may be omitted and a respective electrode arrangement connected via a respective matchbox to reference potential or by further omission of that matchbox, such electrode arrangement may directly be connected to reference potential.

Further, two or three of the generators shown may be realised as one single generator connected via different matchboxes on the respective electrode arrangements. The skilled artisan will recognise the huge number of control possibilities for the electrical signals $V_{nm}$, for the minimum number electrode arrangement as shown in FIG. 8 and a generalised electrode arrangement of a sub-electrode set 12 with m sub-electrode groups and an electrode 20 also subdivided in n sub-electrode groups.

The matchboxes, which are either passive impedance networks or may possibly include active sources considerably contribute to the formation of the DC bias at the respective electrode arrangements, i.e. the spectral amplitude at zero frequency.

In FIG. 9, departing from the example of FIG. 7, there is schematically shown a preferred structure of a today's implementation of the reactor according to the present invention. This preferred structure shall be the basis for the analysis as follows. Thereby, the electrode arrangement 10 is subdivided into parallel sub-electrode bars 12, grouped in two groups A and B respectively driven by RF voltages $V_{11}$ and $V_{12}$ with respect to ground potential applied to the electrode arrangement 20. Grouping the sub-electrodes 12 is periodic, as may clearly be seen from FIG. 9. The sub-electrodes 12 belonging to the respective groups are interconnected to the respective input by feed-bus $7_A$ and $7_B$.

The sub-electrodes of the group A define for plasma coupling surfaces $A_A$, whereas the sub-electrodes of group B define such surface $A_B$. The electrode arrangement 20 is coupled to the plasma reaction volume via surface $A_{20}$. Both sub-electrode groups are capacitively coupled to the plasma via the respective sheath.

Let us assume:

$$V_{11} = V_o \exp(i\phi), \quad V_{12} = V_o \exp(i-\phi) \quad (4)$$

for the two sub-electrode group driving RF voltages, i.e. the two voltages have the same amplitude, but have a mutual phase shift of $2\phi$. Phase $\phi$ and/or amplitude $V_o$ may be adjustable or even modulatable. As will be shown, such a reactor according to FIG. 7 and more generically according to FIG. 8, realised e.g. according to FIG. 9 allows to control ion bombardment regardless of workpiece or substrate size and especially in a planar geometry. Indeed, the design according to the FIGS. 7 to 9 can be extended according to the workpiece extent to be treated.

As may be seen from FIG. 9 the sub-electrodes are additionally tailored to enlarge the overall coupling surface $A_{A,B}$ of the electrode arrangement 10. Due to a slope $\theta$ of the roof-shaped sub-electrode bars 12, with $\theta=45°$ according to FIG. 9, the surfaces are as follows:

$$A_A = A_B = A_{20}/2 \cos(\theta). \quad (5)$$

Note that, as shown in FIG. 10, which represents an enlarged part of the reactor structure according to FIG. 9, the RF coupling surfaces are evaluated in the central part of the reactor on one unit of the periodic structure. If the workpiece 4 and thus the reactor itself are very large, the border effects can indeed be neglected in this calculation. With respect to accurately controlling even such border effects, we refer to FIG. 25 and FIGS. 26 to 28 as well as to the respective description later on.

Please note that in FIG. 10 the plates $S_{11}$, $S_{12}$, $S_{20}$ represent the respective parts of electrode surfaces acting as capacitive plates.

The continuity of RF current implies the following equations:

$$(V_o \exp(+i\phi)-V_p)C_{11}+(V_o \exp(-i\phi)-V_p)C_{22}=V_p C_{20} \quad (6)$$

Because $A_A = A_B$ and $/V_{11}/=/V_{12}/$, then, $V_p$ is real, it has a phase centered between $V_{11}$ and $V_{12}$. The result is expressed in a rather complex form:

$$tg^2(\phi) = ((X/\cos\theta)^{2/\alpha} - X^2)/(1+X)^2 \quad (7)$$

where $$X = \cos\theta(V_o/V_p) - 1.$$

This relation was calculated for $\alpha=0.5$ (n=2) and the results are displayed in FIG. 11. FIG. 11 shows the percentage of the driving RF voltage amplitude which is present at the boundary of the sheath facing the bottom electrode 20 on which the substrate 4 is deposited. The calculation was made for four types of saw tooth profile, hence for four values of the angle $\theta$. For zero phase shift, in other words when all electrode groups are driven by the same RF voltage, one recovers the expected results expressed in equation (3). The RF voltage is equally shared when two flat electrodes are facing each other ($\theta=0°$). When the electrode is corrugated by the saw tooth structure, then the smallest surface electrode is the bottom electrode arrangement 20 and an increasingly large fraction of RF voltage occurs adjacent and facing the workpiece 4. Very impressive is how effective is phase shifting so as to decrease RF voltage in front of the substrate carrying bottom electrode 20. When the two driving voltages are in phase opposition, then the RP voltage in front of the work-piece carrying bottom electrode 20 becomes zero.

Although it is convenient to consider a mere phase shift between the driving voltages for the two electrode groups A and B according to $V_{11}$ and $V_{12}$, it is not necessary that the voltages on both sub-electrode groups of the array are of the same amplitude, as was explained with the generalised considerations to FIG. 8, and even such amplitudes—single at one frequency, or multiple at several spectral frequencies—may vary in time. Thus, amplitude modulation, frequency modulation or phase modulation may be used. Additionally or instead of the varying phasing it is e.g. also possible to vary the amplitude ratio of the driving RF voltages. For the dual periodic array as shown in the FIGS. 9 and 10, which is one preferred embodiment of the arrangement according to FIG. 8, and still with a phase shift of $2\phi$, varying the one frequency amplitude may be expressed as follows:

$$V_{11} = V_o \exp(i\phi), \quad V_{12} = av_o \exp(-i\phi). \quad (8)$$

in which "a" is a real coefficient between 0 and 1.

As an example we consider the case of a dual periodic array with no phase shift $\phi$ ($\phi=0$ in equation (8) but only with a variation of the amplitude of the RF voltage at the RF input for group B, $V_{12}$. The calculation can be done the same way as above. For illustration, FIG. 12 shows the result for a saw tooth dual array with $\theta=45°$ and n=2. FIG. 12 displays the variation of the plasma RF voltage above the substrate relatively to the amplitude of the main voltage amplitude $V_o$ when the amplitude of the voltage at $V_{12}$ is varied according to "a" of (8). It is found that the plasma voltage can vary from 15 to 67% when the amplitude $aV_o$ of the voltage $V_{12}$ is varied. Even more striking is the variation the self bias of the main electrode. The self bias is calculated by assuming that the plasma sheaths are perfectly rectifying the RF voltage. It is found that the self bias changes sign when the voltage amplitude of $V_{12}$ is varied.

Before reporting some experimental results a preferred form of realisation of the reactor according to the present invention shall be described with the help of FIG. 13.

The bars as sub-electrodes 12 of group A are connected to the common bus-bar $7_A$ and the bars of group B to the common bus-bar $7_B$. The bus-bars 7 are respectively connected to RF power inputs $8_A$ and $8_B$. In order to avoid spurious plasma ignition the back of the sub-electrode array and the spaces between the electric connections to the sub-electrode bars 12 are shielded by spacer shields 9. The substrate 4 is deposited on the opposite electrode 20 which is preferably grounded. All electrodes in this embodiment are cooled or temperature-controlled by a circulating fluid. The fluid is circulating in conducts 11 in the sub-electrode bars 12 of the arrangement 10 and in the base electrode arrangement 20 in conducts 12. The plasma 13 is filling the plasma gap between the electrode arrangements 10 and 20 which gap GP being somewhat larger than the distance P between two adjacent sub-electrodes 12.

As was already noted in the preferred embodiment according to FIG. 13, but also according to FIGS. 7 to 10, the two sub-electrode groups are of equal surface, but it is also possible to consider the case of unbalanced surfaces of the sub-electrode groups surfaces. As also shown in the FIGS. 9 and 10 the surface of the sub-electrode subdivided arrangement 10 is voluntarily corrugated on the side facing the plasma 13. The purpose of this is to increase the surface of contact between the plasma and the electrode arrangement 10. Note that the profile of a sub-electrode 12 is effective in increasing the contact surface if the geometrical features are wide enough for the plasma to penetrate into the resulting corrugation. In the embodiment according to FIG. 13 the sub-electrode bars have again θ=45°. The surface of contact between the electrode arrangement 10 and the plasma 13 is therefore increased by a factor of $\sqrt{2}$ compared to the flat base electrode arrangement 20.

In a further preferred embodiment the base electrode 20 may be construed as a chuck for holding by suction flat workpieces 4 as glass plates to be treated. To realize such a chuck there is (not shown in FIG. 13) realized within electrode arrangement 20 a system of suction channels which abut in a multitude of suctioning holes at the upper surface of electrode 20 to snugly hold the workpiece 4 during treatment, or there is provided an electrostatic chuck.

Experiments were performed on a reactor construed as shown in FIG. 13. Both extremes with respect to RF driving were performed, namely where both electric inputs $8_A$ and $8_B$ were driven together and thus $V_{11}=V_{12}$ (see FIG. 9) and where one of the inputs $8_B$ or $8_A$ was grounded, thus realizing a=0 according to (8). The self bias potential and the RF driving amplitude were measured. As seen in Table 1, the results are qualitatively very satisfactory. In particular one observes a spectacular change of signum of the self bias when the electrode equivalent contact surface is reduced by a factor of 2 when varying the RF voltage applied to one sub-electrode group from nominal to zero. The absolute value of RF self bias does not match the theoretical estimation. This is mainly due to the fact that the measurements were performed on a rather small reactor of 500×500 mm². The calculation for an infinite reactor as shown in FIG. 12 must be corrected to take into account the contributions of the reactor edges to RF coupling. This was done in an approximate way in Table 1. Nevertheless, the drastic variations of the DC bias are astonishing. The RF bias of the processing plasma in front of the workpiece can be drastically changed by relative variation of RF input voltages on the sub-electrode groups.

TABLE 1

Comparison experiment-theory for a dual array with 45° saw tooth. The corrected value is derived from a calculation as above but roughly accounting for the edge effects which are far to be negligible in relatively small reactors.

| SET UP | MEASURED ON REACTOR | | | RATIO CALCULATED | |
|---|---|---|---|---|---|
| RF inlets | $V_0$ RF | Self bias | ratio | corrected | calculated |
| two in parallel | 306 V | +244 V | 0.79 | 0.62 | 0.33 |
| one grounded | 360 V | −142 V | −0.39 | −0.59 | −0.71 |

The sub-electrode design according to FIGS. 9, 10 and 13 is very simple. It is the most simple periodic structure. From the bottom it appears as parallel stripes as shown in FIG. 14 with alternated connections to the two RF inputs.

Such a periodic design can also be made periodic in two dimensions, x/y of FIG. 7. Such an example is shown schematically in FIG. 15 for a square-shaped sub-electrode 12.

Similarly, a dual array of triangular sub-electrodes 12 can be made as schematically shown in FIG. 16. An even more sophisticated approach is shown in FIG. 17 where a triple array with three RF inputs and three groups A, B, C of sub-electrodes is realized. Again, the three corresponding driving RF voltages or more generic signal spectra can be out of phase and/or of different amplitudes, possibly even of different frequencies and/or voltage-shapes, the signals may have different spectra.

The periodic structure of the sub-electrode array can also introduce features with respect to electrode surface as does the tooth pattern which was described. A diamond shape as shown in FIG. 18 increases the RF capacitive coupling surface of each sub-electrode and may be applied to different sub-electrode structures e.g. as shown in the FIGS. 15 to 17. The sub-electrode profile can also be rounded as shown in cross-section in FIG. 19. One of the only limitations for the design rules of the electrode array structure is that when shaping the sub-electrode units, hollow volumes or volumes open to the plasma reaction volume such as holes, grooves or slots shall be wider than twice sheath thickness or dark space distance so that the plasma penetrates deeply into such recesses. In a typical plasma process the sheath thickness is a few mm, hence it is reasonable to assume that no hollow intrusion on the surface of electrode arrangement 10 should be narrower than about 1 cm if such intrusion shall add to the active coupling surface of such electrode.

Considering the reactor according to the present invention and as most generically shown in FIG. 8, it must be stated that laying the workpiece flat on the bottom horizontal electrode arrangement 20 is the most convenient approach, but the same design can be realized vertically or with the substrate and electrode arrangement 20 at top if appropriate workpiece and especially substrate holding is realized. Such different geometric arrangement can be considered with an eye on particle control.

Some preferred additional features shall be explained with an eye on FIG. 20 which shows an enlarged cross-sectional view of the sub-electrode array. In order to limit the capacitive coupling between the sub-electrodes of the e.g. two sub-electrode groups the gaps 23 between adjacent sub-electrodes can be provided with spacers 24. These spacers can be made of an insulating material such as of ceramic or of a metal, either at floating potential or at a defined potential intermediate the potentials applied to the adjacent sub-electrodes. Similarly, a shield 26 above the sub-electrodes reduces the capacitive coupling, either between the sub-electrodes and/or from the sub-electrodes to the backing ground plate 25. This shield 26 can be continuous, but then it shall be made of an insulating material such as of ceramic or if it is metallic, it shall be interrupted as shown in FIG. 20. Several shielding layers can be interposed to improve capacitive decoupling. In FIG. 20 a second shield 27 is shown to improve decoupling between the sub-electrode array and the backing ground plate 25. The shield 27 is actually a grid to allow gas to flow therethrough.

This introduces another advantage of the sub-electrode array. One can take advantage of the spacings or gaps 23 between the sub-electrodes to allow a gas 31 to flow between the sub-electrodes and into the reaction volume. For this, a process gas 31 is introduced through a piping 28 into the area behind the sub-electrode array. Means may be provided to uniformly distribute the inlet gas 31 to the gas outlets 23 as e.g. realized by the grid shield 27.

Some further considerations to the RF feed system:

From the sub-electrode groups provided, at least one with at least one sub-electrode is to be RF-voltage driven.

The inputs to the groups of sub-electrodes for RF voltage shall be realized through vacuum feed-throughs 41 as shown in FIG. 20. Thereby, as is customary for RF feed, as was discussed there is provided a matching box 42 matching the output of amplitude and/or phase adjustable or modulatable RF generators 43 and 44 which generate narrow-band or wide-band signal spectra. Thus, one generator 44 may e.g. be adjustable in its sole amplitude of its output RF signal whereas the second generator 43 may be adjustable in phasing at a single spectral frequency. Phase shift of the two RF signals input to two or more groups of the sub-electrode array may also be performed within the matching box 42. For the skilled artisan there are many different ways for implementing the RF drive to the reactor according to the present invention and as shown in FIG. 8.

A today preferred technique is schematically shown in FIG. 22. There is provided one RF oscillator 47, the one frequency RF output thereof being led via an adjustable phase shifter unit 48 on a power amplifier 49 and additionally directly on the input of a second power amplifier 50. Preferably, the amplifiers 49 and 50 are tailored to accept large reflected power and they are coupled to the RF inputs of the reactor via simple passive matching circuitry in order to roughly match the plasma impedance to the generator impedance. Another preferred design is shown in FIG. 23 where two amplifier output stages 55 and 56 are driven by the same—one frequency—RF oscillator but provide for independent adjustment of amplitude and/or phasing of the output RP voltage. The output of the amplifier stage 55 is coupled through a matchbox to the primary winding 51 of a transformer. The secondary winding 60 of the transformer provides an RF voltage difference between the group inputs to the sub-electrode groups according to the present invention. The central point of secondary winding 52 is connected via a matchbox 54 to the output of the second amplifier output stage 56. Phase control and/or amplitude control is preferably performed at amplifier stages 56 and/or 55.

Thus, the most generic aspect of the reactor according to the present invention is to provide at least one sectioned electrode. In spite of the preferred examples described it might be interesting not to evenly space the sub-electrodes e.g. for resolving general etching problems with respect to homogeneous treatment distribution. Sub-electrodes of annular shape or of frame-like shape may be arranged around a central axis. Such a centric grouping of the sub-electrodes is schematically shown in FIG. 24.

Further, it must be pointed out that it is absolutely possible to operate one or the other or more than one of the sub-electrode groups at a predetermined non-RF potential such as on DC. It is further evident that the RF generator arrangements with phase and amplitude and possibly even frequency adjustment may be realized digitally thereby providing a power amplifier output stage to feed the sub-electrode group inputs. Also, as the inventive concept allows for separate independent inputs, it is well suited to drive the different sub-electrode groups by differently shaped voltages according to different signal spectra, briefly, one has complete freedom to operate the sub-electrode groups at any electric signal desired and mutually independently.

It is further to be pointed out that e.g. for RIE applications the reactor according to the present invention and with corrugated surface enlarging sub-electrodes may be operated with all sub-electrode groups on the same RF voltage whereby the mere fact of enlarged electrode surface at the structured electrode arrangement significantly improves ion bombardment of the substrate deposited on the counter electrode arrangement according to arrangement 20 of FIG. 7. In RIE application and making use of a reactor as shown in FIG. 13, thereby feeding all sub-electrode groups with the same RF voltage, it was possible to treat glass substrates of 370×370 mm extent by carbon deposition with a coating uniformity according to maximum deviations of 5% from the desired thickens. After treatment, the reactor was cleaned by an oxygen plasma.

Further consideration must be given to cooling and heating of the substrate to be treated. Thus, and according to electrode 20 of FIG. 13, cooling/heating is preferably accurately controlled so as to reach different substrate temperatures, depending whether the substrate is coated as by chemical vapour deposition in the inventive reactor or is etched. For etching substrates, and especially substrates which are provided with a photolacquer layer, the substrate temperature is to be maintained preferably below photolacquer melting temperature. Thus, for such operation, the substrate, e.g. on electrode 20 of FIG. 13, is cooled by the cooling system 12 to a temperature in the range of 40° C. to 80° C.

If the reactor is used for layer deposition on the substrate as for performing plasma enhanced vapour deposition, then the substrate is preferably heated, e.g. to about 200° C. This considerably improves the quality of the deposited layers in that the layers are deposited with reduced stress, necessitating no additional heat treatment. It is thereby rather uncustomary to heat the substrates during PECVD to such relatively high temperatures.

Looking back on FIG. 7, of $V_{11}$, $V_{12}$, $V_{13}$ . . .

at least one comprises an effective RF spectrum all signals at a one-side electrode (substrate or no-substrate electrode) may be the same DC, AC, pulsating ramp and all kinds of signals resulting from super-position may be applied, as DC+AC+ramp.

Especially in the embodiment according to FIG. 9 the sub-electrode groups may be driven at one common signal whereby for such a case the sub-electrodes might be conductively linked to form a corrugated electrode area so as to enlarge surface area. The same is valid for structures as shown in FIGS. 14 to 19.

Up to now we did not describe any features at the inventive reactor to deal with border effects with respect to homogeneity of substrate treatment. In FIG. 25 there is shown an inventive reactor according to FIG. 9 and electrically driven generically as was discussed in connection with FIG. 8, whereby there is provided besides the two groups of sub-electrodes driven at $V_{11}$, $V_{12}$ a border electrode 50 of e.g. triangular cross-sectional shape as shown. This border electrode 50 is generically electrically operated via a matchbox $MB_B$ and a generator $G_B$. Thereby, again, the generator $G_B$ may generate a signal of predetermined spectrum, possibly frequency, phase or amplitude modulated, thereby may generate a single frequency signal or such generator $G_B$ may be just omitted, just maintaining the matchbox connected to ground potential. Again the matchbox considerably contributes to the DC bias according to the zero spectral frequency amplitude of the signal $V_{BO}$ prevailing at border electrode 50.

By means of the border or peripheral electrode 50, preferably surrounding the subdivided electrode arrangement 10, and either passively connected preferably via a matchbox to reference potential or actively driven by an additional generator, a considerable improvement with respect to treatment uniformity is reached and especially with respect to etching uniformity at a substrate. Thereby, the border electrode 50 may even be left on floating potential. Preferred operation of the border electrode 50 is nevertheless via a matching box connected to reference potential with or without additional generator $G_B$.

A reactor according to FIG. 25 was operated as follows:

$V_{11}$: RF; 13,56 MHz, 0 V DC bias, 1 kV RF power $V_{20}$: linked to ground potential via a passive adjustable matchbox $V_{BO}$: connected to ground potential via a passive adjustable matchbox $MB_B$ In a $CF_4/SF_6$ a-Si: H-atmosphere, at $5\times10^{-2}$ mbar, the distribution of etching effect on 400 mm×400 mm substrates was tested.

FIG. 26 shows the distribution at:

| | |
|---|---|
| DC bias of $V_{20}$ | −215 V |
| DC bias of $V_{BO}$ | +107 V |
| DC bias of $V_{11}$, $V_{12}$ | 0 V |

FIG. 27 shows the distribution at:

| | |
|---|---|
| DC bias of $V_{20}$ | −320 V |
| DC bias of $V_{BO}$ | −83 V |
| DC bias of $V_{11}$, $V_{12}$ | 0 V |

FIG. 28 shows the distribution at:

| | |
|---|---|
| DC bias of $V_{20}$ | −312 V |
| DC bias of $V_{BO}$ | +3 V. |
| DC bias of $V_{11}$, $V_{12}$ | 0 V |

Therefrom, it is clearly seen that the distribution of process effect along the workpiece may accurately be adjusted by appropriately selecting the respective DC bias signal applied to either of the electrodes.

What is claimed is:

1. A method for manufacturing a workpiece based on a silicon wafer substrate or a flat display with a substrate, comprising:
   (a) providing first and second extended electrode arrangements mutually and substantially constantly spaced and substantially enclosing a plasma reaction volume within a reactor chamber:
   (b) subdividing said first of said electrode arrangements into electrically mutually isolated subelectrodes;
   (c) commonly connecting a first group of said subelectrodes to a common first electric input;
   (d) commonly connecting a second group of said subelectrodes to a second electric input independent of said first electric input; and
   (e) introducing said substrate onto said second electrode arrangement;
   (f) operatively connecting both said first and second electric inputs to one common Rf signal generator via respective signal adjusting unite;
   (g) generating by said Rf signal generation an Rf plasma discharge within said plasma reaction volume; and
   (h) controlling ion bombardment on and along said substrate by respective signal adjusting units operatively connected to said first and second electric inputs.

2. The method of claim 1, wherein subdividing includes shaping said subelectrodes as bars.

3. The method of claim 1, further comprising subdividing said first electrode arrangement into a two-dimensional pattern of said subelectrodes.

4. The method of claim 1, wherein subdividing comprises subdivision of said first electrode arrangements into one of frame-like and annular subelectrodes.

5. The method of claim 1, further comprising grouping of subelectrodes in at least one direction along said first electrode arrangement into a periodically alternating pattern.

6. The method of claim 1, further comprising providing said subelectrodes with surfaces pointing towards said substrate and being convexly or concavely enlarged.

7. The method of claims 1, further providing said first and second electrode arrangements comprised of planar parallel electrode arrangements.

8. The method of claim 1, further comprising applying electric signals to said first and second electric inputs via said signal adjusting units, and mutually controlling said signals with respect to at least one amplitude phasing and signal shapes.

9. The method of claim 1, further comprising spacing neighboring subelectrodes less than by dark space distance of said plasma generated in said plasma reaction volume.

10. The method of claim 1, further comprising controlling temperature of at least one of said first and second electrode arrangements.

11. The method of claim 1, further comprising inletting gas between at least a part of said subelectrodes.

12. The method of claim 11, further comprising providing a gas distribution chamber on a backside of said first electrode arrangement, and inletting gas into said plasma reaction space from between at least some of said subelectrodes.

13. The method of claim 1, further comprising shielding at least some of said subelectrode, at least one of between adjacent ones of said subelectrodes and behind said subelectrodes.

14. The method of claim 1, further comprising providing said first electrode arrangement with a corrugated surface pattern, thereby considerably enlarging a surface of said first electrode arrangement exposed to said plasma.

15. The method of claim 1, further comprising separating neighboring ones of said subelectrodes by intermediate gaps, and providing said subelectrodes with surfaces pointing towards said substrate, said surfaces being convexly enlarged, thereby abruptly enlarging a mutual distance between neighboring subelectrode surfaces beyond said gaps.

16. The method of claim 1, further comprising electrically operating said second electrode via an impedance matching network.

17. The method of claim 1, further comprising providing at least one third electrode arrangement bordering at least one of said first and of said second electrode arrangements.

18. The method of claim 17, further comprising providing said third electrode arangement substantially all around at least one of said first and of said second electrode arrangements.

19. The method of claim 1, further comprising subdividing said first electrode arrangement into more than two groups of said subelectrodes.

20. The method of claim 1, further comprising operating at least one of said first and second inputs and of said second electrode arrangements at a reference potential via at least one of a passive impedance matching network and of an active signal generator, and further generating with said active generator (i) an AC signal of a predetermined or adjustable frequency spectrum, said spectrum being constant in time or varying in time with respect to at least one of spectral amplitudes, frequency distribution and phasing, or (ii) a DC signal.

21. The method of claim 17, further comprising operating said third electrode arrangement at a reference potential via at least one of a passive impedance matching network and of an active signal generator, and further generating with said active generator (i) an AC signal of a predetermined or adjustable frequency spectrum, said spectrum being constant in time or varying in time with respect to at least one of spectral amplitudes, frequency distribution and phasing, or (ii) a DC signal.

22. The method of claim 1, further comprising electrically operating two of said first and said second electric inputs and of said second electrode arrangement with equal electric signals.

23. The method of claim 17, further comprising electrically driving at least two of said third electrode, said first, and said second inputs, and said second electrode arrangement with equal electric signals.

24. The method of claim 1, further comprising selecting a distance between subelectrodes of the same group at most equally to a distance between said first and said second electrode arrangements.

25. A method for manufacturing a workpiece based on a silicon wafer substrate or a flat display with a substrate, comprising
    (a) providing therein a first and a second extended electrode arrangement mutually and substantially constantly spaced and substantially enclosing a plasma reaction volume within a reactor chamber;
    (b) subdividing said first electrode arrangement into electrically mutually isolated subelectrodes;
    (c) connecting commonly a first group of said subelectrodes to a first electric input;
    (d) connecting commonly a second group of said subelectrodes to a second electric input, said first and said second electric inputs being independent of each other;
    (e) providing slits between said subelectrodes of said first electrode arrangement with a width smaller than a dark space distance of a plasma to be generated in said plasma reaction volume;
    (f) introducing said substrate into said reactor and onto said second electrode arrangement;
    (g) generating in said plasma reaction volume an Rf plasma with said first and second electrode arrangements; and
    (h) feeding a gas through said slits between said subelectrodes into said plasma reaction volume.

26. The method of claim 25, further comprising forming said subelectrodes by subelectrode bars.

27. The method of claim 25, further comprising subdividing said first electrode arrangement into a two-dimensional pattern of subelectrodes.

28. The method of claim 25, further comprising subdividing said first electrode arrangement into one of a frame-like and of an annular subelectrode pattern.

29. The method of claim 25, further comprising arranging said subelectrodes of said groups in a periodically alternating pattern in at least one direction along said first electrode arrangement.

30. The method of claim 25, further comprising forming said subelectrodes with surfaces pointing towards said second electrode arrangement, which surfaces are convexly or concavely enlarged.

31. The method of claim 25, further comprising arranging said first and second electrode arrangements substantially planar and mutually parallel.

32. The method of claim 25, further comprising mutually controlling electric signals applied to said first and second electric inputs with respect to at least one of amplitude, phasing and signal shapes.

33. The method of claim 25, further comprising temperature-controlling at least one of said first and said second electrode arrangements.

34. The method of claim 25, further comprising shielding at least one of between adjacent subelectrodes and behind subelectrodes.

35. The method of claim 25, further comprising providing said first electrode arrangement with a corrugated surface pattern to enlarge a surface of the first electrode arrangement exposed to said plasma.

36. The method of claim 25, further comprising providing surfaces of said subelectrodes pointing towards said first electrode arrangement, which surfaces are convely enlarged, whereby a mutual distance of said surfaces of said subelectrode beyond said gaps are abruptly enlarged.

37. The method of claim 25, further comprising electrically feeding said second electrode arrangement via an impedance-matching network.

38. The method of claim 25, further comprising providing at least one third electrode arrangement bordering at least one of said first and of said second electrode arrangements.

39. The method of claim 38, further comprising providing said third electrode arrangement all around at least one of said first and of said second electrode arrangements.

40. The method of claim 25, further comprising subdividing said first electrode arrangement into more than two groups of subelectrodes.

41. The method of claim 25, further comprising operating at least one of said first and of said second electrode arrangements at a reference potential via at least one of a passive impedance matching network and of an active signal generator and further generating with said signal generator (i) an AC signal of a predetermined or adjustable frequency spectrum, said spectrum being constant in time or varying in time with respect to at least one of spectral amplitudes, frequency distribution and phasing, or (ii) a DC signal.

42. The method of claim 38, further comprising operating said third electrode arrangement at a reference potential via at least one of a passive impedance matching network and of an active signal generator and further generating with said active generator (i) an AC signal of a predetermined or adjustable frequency spectrum, said spectrum being constant in time or varying in time with respect to at least one of spectral amplitudes, frequency distribution and phasing, or (ii) a DC signal.

43. The method of claim 20, further comprising electrically operating said two of first and second electric inputs and of second electrode arrangements with equal electric signals.

44. The method of claim 38, further comprising electrically driving at least two of said third electrode arrangement, said first and said second inputs, and said second electrode arrangement with equal electric signals.

45. The method of claim 25, further comprising selecting a distance between subelectrodes of the same group to be at most equal to a distance of said first and second electrode arrangements.

* * * * *